(12) United States Patent
Iwamoto et al.

(10) Patent No.: US 6,841,845 B2
(45) Date of Patent: Jan. 11, 2005

(54) ALLOY TYPE THERMAL FUSE AND WIRE MEMBER FOR A THERMAL FUSE ELEMENT

(75) Inventors: Miki Iwamoto, Osaka (JP); Naotaka Ikawa, Osaka (JP); Toshiaki Saruwatari, Osaka (JP); Yoshiaki Tanaka, Osaka (JP)

(73) Assignee: Uchihashi Estec Co., Ltd., Osaka (JP)

( * ) Notice: Subject to any disclaimer, the term of this patent is extended or adjusted under 35 U.S.C. 154(b) by 0 days.

(21) Appl. No.: 10/616,087

(22) Filed: Jul. 8, 2003

(65) Prior Publication Data
US 2004/0021499 A1 Feb. 5, 2004

(30) Foreign Application Priority Data

Jul. 16, 2002 (JP) ..................................... P2002-207236

(51) Int. Cl.[7] .......................... H01L 29/00; H01H 85/04
(52) U.S. Cl. ...................................... 257/529; 337/159
(58) Field of Search ........................... 257/529; 337/159

(56) References Cited

U.S. PATENT DOCUMENTS 5,982,268 A * 11/1999 Kawanishi .................. 337/297

FOREIGN PATENT DOCUMENTS

| JP | 2002-25402 A | | 1/2002 |
|---|---|---|---|
| JP | 2002025404 | * | 1/2002 |

* cited by examiner

Primary Examiner—Amir Zarabian
Assistant Examiner—Kiesha Rose
(74) Attorney, Agent, or Firm—Akin Gump Strauss Hauer & Feld, LLP

(57) ABSTRACT

An alloy type thermal fuse is provided in which, although a fuse element essentially comprising an In-Sn alloy is used, the operation stability to a heat cycle can be satisfactorily assured, and, even when the amount of In is large, a process of drawing to the fuse element at a high yield can be ensured, and which has an operating temperature belonging to the range of 120 to 150° C. The fuse element has an alloy composition in which 0.1 to 7 weight parts of one, or two or more metals selected from the group consisting of Ag, Au, Cu, Ni, Pd, Pt, and Sb are added to 100 weight parts of an alloy of 52 to 85% In and a balance Sn.

4 Claims, 3 Drawing Sheets

ALLOY TYPE THERMAL FUSE AND WIRE MEMBER FOR A THERMAL FUSE ELEMENT

BACKGROUND OF THE INVENTION

1. Field of the Invention

The present invention relates to an alloy type thermal fuse in which the operating temperature belongs to the range of about 120 to 150° C., and a wire member for such a thermal fuse element.

2. Description of the Prior Art

An alloy type thermal fuse is widely used as a thermoprotector for an electrical appliance or a circuit element, for example, a semiconductor device, a capacitor, or a resistor.

Such an alloy type thermal fuse has a configuration in which an alloy of a predetermined melting point is used as a fuse element, a flux is applied to the fuse element, and the flux-applied fuse element is sealed by an insulator.

The alloy type thermal fuse has the following operation mechanism.

The alloy type thermal fuse is disposed so as to thermally contact an electrical appliance or a circuit element which is to be protected. When the electrical appliance or the circuit element is caused to generate heat by any abnormality, the fuse element alloy of the thermal fuse is melted by the generated heat, and the molten alloy is divided and spheroidized because of the wettability with respect to a lead conductor or an electrode under the coexistence with the flux that has already melted. The power supply is finally interrupted as a result of advancement of the division and spheroidization. The temperature of the appliance is lowered by the power supply interruption, and the divided molten alloys are solidified, whereby the non-return cut-off operation is completed. Therefore, it is requested that the division temperature of the fuse element alloy is substantially equal to the allowable temperature of an electrical appliance or the like.

Usually, a low-melting alloy is used as such a fuse element. As apparent from a phase equilibrium diagram, an alloy has a solidus temperature and a liquidus temperature, and, at the eutectic point where the solidus temperature coincides with the liquidus temperature, the alloy is changed all at once from the solid phase to the liquid phase by heating which causes the alloy to pass the eutectic temperature. By contrast, in a composition other than the eutectic point, an alloy is changed in the sequence of the solid phase→the solid-liquid coexisting phase→the liquid phase, and the solid-liquid coexisting region temperature width $\Delta T$ exists between the solidus temperature Ts and the liquidus temperature T1. Even in the solid-liquid coexisting region, there is the possibility that the division of a fuse element occurs, although the possibility is low. In order to reduce the dispersion of the operating temperature among thermal fuses, it is requested to use an alloy composition in which the solid-liquid coexisting region temperature width $\Delta T$ is as narrow as possible. One of conditions imposed on an alloy type thermal fuse is that $\Delta T$ is narrow.

In many cases, a fuse element of an alloy type thermal fuse is used in the form of a linear piece. In order to reduce the size of a thermal fuse so as to comply with the recent tendency that appliances are further miniaturized, it is sometimes demanded to realize a thin fuse element. A fuse element is often requested to have drawability to a small diameter (for example, 400 $\mu m\phi$ or smaller).

In recent electrical appliances, the use of materials harmful to a living body, particularly metals such as Pb, Cd, Hg, and Tl is restricted because of increased awareness of environment conservation. Also a fuse element for a thermal fuse is requested not to contain such a harmful metal.

When alloy type thermal fuses are classified according to operating temperature, thermal fuses of an operating temperature of 120 to 150° C. are widely used.

As apparent from a phase equilibrium diagram of an In—Sn alloy, in an alloy of 85 to 52% In and a balance Sn, the liquidus temperature is 119 to 145° C. In this range, as compared with the range of an alloy composition of 52 to 43% In and a balance Sn where the liquidus temperature is similarly 119 to 145° C., the solidus temperature is higher, and hence the solid-liquid coexisting region temperature width is narrow. Therefore, the alloy of 85 to 52% In and a balance Sn satisfies the above-mentioned requirements such as that the reduced dispersion of the operating temperature, the operating temperature in the range of 120 to 150° C. (in a thermal fuse, usually, the fuse element temperature is assumed to be lower by several degrees centigrade than the surface temperature, and the operating temperature to be higher by several degrees centigrade than the melting point of the fuse element), and environment conservation of harmful metal free.

Usually, In has high ductility, and an alloy containing a large amount of In has excessive ductility, so that such an alloy is hardly drawn.

However, an alloy type thermal fuse of an operating temperature of 120 to 130° C. has been proposed in which, assuming that an In—Sn alloy containing In of 70% or less can be drawn, an alloy of 70 to 52% In and a balance Sn (the lower limit of In is set to 52% in order to suppress dispersion of the operating temperature as descried above) is used as a fuse element (Japanese Patent Application Laying-Open No. 2002-25402).

Because of load variations of an appliance, temperature variations, or the like, a thermal fuse is subjected to a heat cycle, and thermal stress is applied to a fuse element. In a usual alloy type thermal fuse, however, the characteristics of a fuse element is not changed by such thermal stress.

However, the inventors has noted that, when the above-mentioned In—Sn alloy containing In of 52% or more is used as a fuse element, a resistance variation of the resistance of a fuse element (rise of the resistance) is remarkably caused by a heat cycle. This phenomenon is produced by the fact that a slip in the interface between different phases in the alloy structure is increased, and such a slip repeatedly occurs, whereby a change of a sectional area or an elongation of the fuse element is caused in an excessive manner.

When such an increase of the resistance occurs, the temperature of the fuse element is raised by Joule's heat. Therefore, a problem is caused in which, when the temperature rise is indicated by $\Delta T$, the fuse operates at a temperature that is lower than the allowable temperature of an appliance by the temperature rise $\Delta T$, and, when the temperature rise $\Delta T$ is large, a serious operation error may occur.

SUMMARY OF THE INVENTION

It is an object of the invention to provide an alloy type thermal fuse in which, although a fuse element essentially comprising an In—Sn alloy is used, the operation stability to a heat cycle can be satisfactorily assured, and, even when the amount of In is large, a process of drawing to the fuse element at a high yield can be ensured, and which has an operating temperature belonging to the range of 120 to 150° C.

In embodiment 1 of the invention, a wire member for a thermal fuse element has an alloy composition in which 0.1 to 7 weight parts of one, or two or more metals selected from the group consisting of Ag, Au, Cu, Ni, Pd, Pt, and Sb are added to 100 weight parts of an alloy of 52 to 85% In and a balance Sn.

In embodiment 2 of the invention, the wire member for a thermal fuse element is used as a fuse element. In embodiment 3 of the invention, a heating element for fusing off the fuse element is additionally disposed.

In each of the embodiments, the alloy composition is allowed to contain inevitable impurities which are produced in productions of metals of raw materials and also in melting and stirring of the raw materials.

According to the invention, it is possible to obtain a wire member for a thermal fuse element in which the liquidus temperature is 120 to 150° C., which essentially comprises an In—Sn system of a narrow solid-liquid coexisting region temperature width (6° C. or narrower), and in which, while the melting characteristic is sufficiently maintained, thermal fatigue and strength are satisfactorily improved by adding Ag, Au, Cu, Ni, Pt, Pd, Sb, or the like. Therefore, it is possible to provide an alloy type thermal fuse in which the initial operation characteristic can be satisfactorily maintained in heat cycles, an excellent productivity can be assured by a high yield of the drawing process of the fuse element, the operating temperature belongs to the range of 120 to 150° C., and dispersion of the operating temperature is sufficiently small, and which is suitable for environment conservation.

DETAILED DESCRIPTION OF THE PREFERRED EMBODIMENTS

In the invention, the fuse element basically comprises an alloy composition of 52 to 85% In and the balance Sn because of the following reason. Since the liquidus temperature is 115 to 145° C. and the solid-liquid coexisting region temperature width is narrow or about 6° C. or narrower, the operating temperature of the thermal fuse can be set to 120 to 150° C., and dispersion of the operating temperature can be set to be small (4 to 5° C. or smaller). Moreover, 0.1 to 7 weight parts of one, or two or more metals selected from the group consisting of Ag, Au, Cu, Ni, Pd, Pt, and Sb are added because of the following reason. An intermetallic compound of at least one of these metals and In or Sn having high ductility is produced. Slippage between crystals is caused to hardly occur by the wedge effect due to the intermetallic compound, the thermal resistance stability to a heat cycle is ensured, and sufficient strength against a drawing process is provided to enable a process of drawing to a thin wire of diameter of 300 $\mu$m$\phi$ to be easily performed. When the addition amount is smaller than 0.1 weight parts, the effects due to the addition cannot be satisfactorily attained. When the addition amount is larger than 7 weight parts, the rise of the liquidus temperature and the increase of the solid-liquid coexisting region temperature width are excessive, and the operating temperature of the thermal fuse is hardly set to a predetermined temperature belonging to the range of 120 to 150° C.

In the invention, the fuse element can be produced by drawing a base material of an alloy, and used with remaining to have a circular section shape or with being further subjected to a compression process to be flattened. In the case of a round wire, the outer diameter of the fuse element is 200 to 600 $\mu$m$\phi$, preferably, 250 to 350 $\mu$m$\phi$.

The invention may be implemented in the form of a thermal fuse serving as an independent thermoprotector. Alternatively, the invention may be implemented in the form in which a thermal fuse element is connected in series to a semiconductor device, a capacitor, or a resistor, a flux is applied to the element, the flux-applied fuse element is placed in the vicinity of the semiconductor device, the capacitor, or the resistor, and the fuse element is sealed together with the semiconductor device, the capacitor, or the resistor by means of resin mold, a case, or the like.

Figure 1:
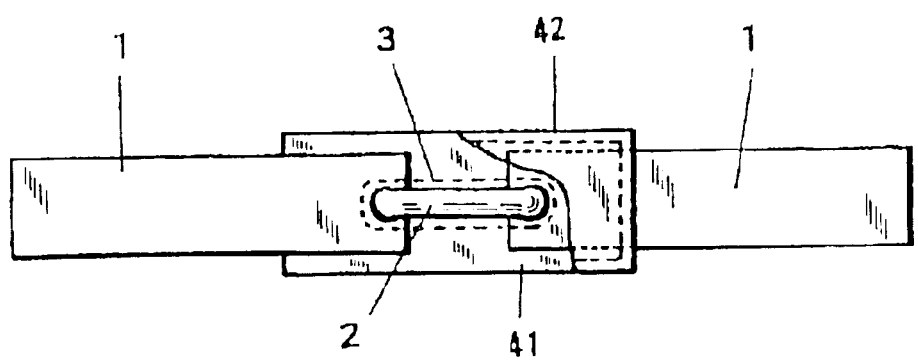
FIG. 1 is a view showing an example of the alloy type thermal fuse of the invention.

FIG. 1 shows a tape-like alloy type thermal fuse according to the invention. In the fuse, strip lead conductors 1 having a thickness of 100 to 200 $\mu$m are fixed by an adhesive agent or fusion bonding to a plastic base film 41 having a thickness of 100 to 300 $\mu$m. A fuse element 2 having a diameter of 250 to 500 $\mu$m$\phi$ is connected between the strip lead conductors. A flux 3 is applied to the fuse element 2, The flux-applied fuse element is sealed by means of fixation of a plastic cover film 42 having a thickness of 100 to 300 $\mu$m by an adhesive agent or fusion bonding.

Figure 2:
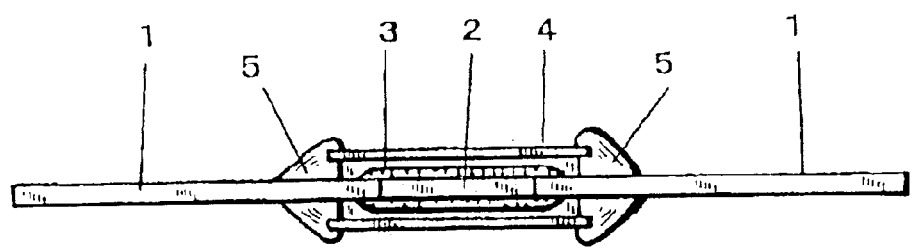
FIG. 2 is a view showing another example of the alloy type thermal fuse of the invention.

FIG. 2 shows a fuse of the cylindrical case type. A low-melting fusible alloy piece 2 is connected between a pair of lead wires 1, A flux 3 is applied to the low-melting fusible alloy piece 2, The flux-applied low-melting fusible alloy piece is passed through an insulating tube 4 which is excellent in heat resistance and thermal conductivity, for example, a ceramic tube. Gaps between the ends of the insulating tube 4 and the lead wires 1 are sealingly closed by a cold-setting sealing agent 5 such as an epoxy resin.

Figure 3:
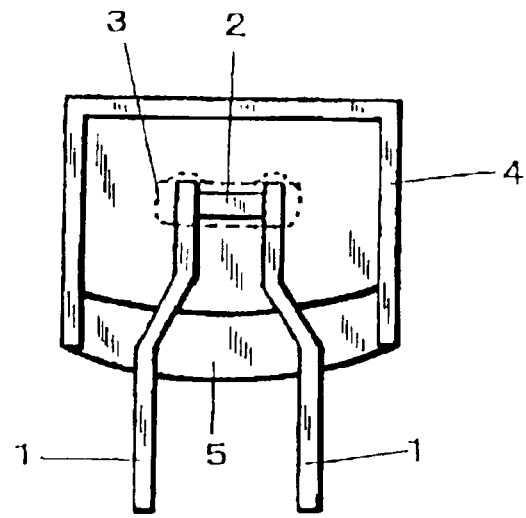
FIG. 3 is a view showing a further example of the alloy type thermal fuse of the invention.

FIG. 3 shows a fuse of the radial case type. A fuse element 2 is bonded between tip ends of parallel lead conductors 1 by welding. A flux 3 is applied to the fuse element 2, The flux-applied fuse element is enclosed by an insulating case 4 in which one end is opened, for example, a ceramic case. The opening of the insulating case 4 is sealingly closed by a sealing agent 5 such as an epoxy resin.

Figure 4:
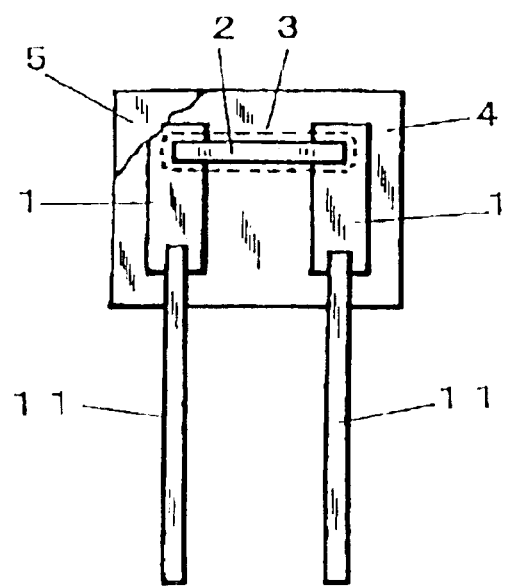
FIG. 4 is a view showing a still further example of the alloy type thermal fuse of the invention.

FIG. 4 shows a fuse of the substrate type. A pair of film electrodes 1 are formed on an insulating substrate 4 such as a ceramic substrate by printing of conductive paste (for example, silver paste). Lead conductors 11 are connected respectively to the electrodes 1 by welding or the like. A fuse element 2 is bonded between the electrodes 1 by welding. A flux 3 is applied to the fuse element 2, The flux-applied fuse element is covered by a sealing agent 5 such as an epoxy resin.

Figure 5:
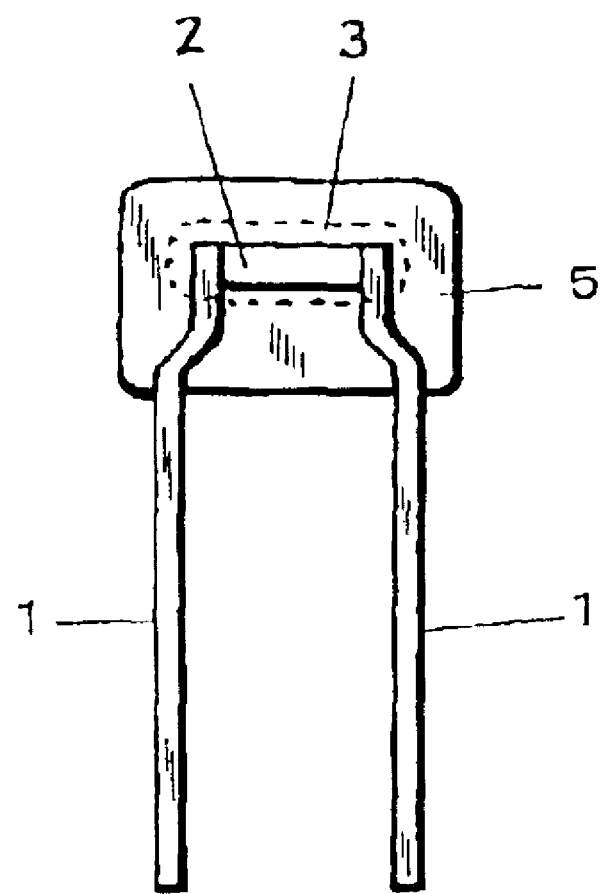
FIG. 5 is a view showing a still further example of the alloy type thermal fuse of the invention.

FIG. 5 shows a fuse of the radial resin dipping type. A fuse element 2 is bonded between tip ends of parallel lead conductors 1 by welding. A flux 3 is applied to the fuse element 2, The flux-applied fuse element is dipped into a resin solution to seal the element by an insulative sealing agent such as an epoxy resin 5.

The invention may be implemented in the form in which a heating element is additionally disposed on the alloy type thermal fuse, for example, a film resistor is additionally disposed by applying and baking resistance paste (e.g., paste of metal oxide powder such as ruthenium oxide), a precursor causing abnormal heat generation of an appliance is detected, the film resistor is energized to generate heat in response to a signal indicative of the detection, and the fuse element is fused off by the heat generation.

In this case, the heating element is disposed on the upper face of an insulating substrate, and a heat-resistant and thermal-conductive insulating film such as a glass baked film is formed on the heating element. A pair of electrodes are disposed, flat lead conductors are connected respectively to the electrodes, and the fuse element is connected between the electrodes. A flux covers a range over the fuse element and the tip ends of the lead conductors. An insulating cover is placed on the insulating substrate, and the periphery of the insulating cover is sealingly bonded to the insulating substrate by an adhesive agent.

As the flux, a flux having a melting point which is lower than that of the fuse element is generally used. For example, useful is a flux containing 90 to 60 weight parts of rosin, 10 to 40 weight parts of stearic acid, and 0 to 3 weight parts of an activating agent. In this case, as the rosin, a natural rosin, a modified rosin (for example, a hydrogenated rosin, an inhomogeneous rosin, or a polymerized rosin), or a purified rosin thereof can be used. As the activating agent, hydrochloride of diethylamine, hydrobromide of diethylamine, an organic acid such as adipic acid can be used.

EXAMPLES

The operating temperatures of examples and comparative examples which will be described later were measured in the following manner. Fifty specimens which were of the substrate type were used. Each of the specimens was immersed into an oil bath in which the temperature was raised at a rate of 1° C./min., while supplying a current of 0.1 A to the specimen. The temperature of the oil when the current supply was interrupted by blowing-out was measured.

With respect to the change in resistance of a fuse element caused by heat cycles, 50 specimens were used, and judgment was made by measuring a resistance change after a test of 500 heat cycles in each of which specimens were heated to 110° C. for 30 minutes and cooled to −40° C. for 30 minutes. Thereafter, examples in which no resistance change was observed were judged ⊚, those in which a resistance change of a small degree was observed (the resistance after heat cycles was not larger than 1.5 times that before the heat cycles) were judged ○, those in which a resistance change of a large degree was observed (the resistance after heat cycles was not smaller than 1.5 times that before the heat cycles) were judged Δ, and those in which the resistance change was ∞ were judged x.

Example 1

A base material of an alloy composition in which 0.4 weight parts of Ag were added to 100 weight parts of 65% In and the balance Sn was drawn into a wire of 300 µmφ in diameter. The draw-down ratio per dice was 6.5%, and the drawing speed was 45 m/min. In the wire, no breakage occurred.

The wire was cut into pieces of 4 mm, and small substrate type thermal fuses were produced with using the pieces as fuse elements. A composition of 80 weight parts of rosin, 20 weight parts of stearic acid, and 1 weight part of hydrobromide of diethylamine was used as a flux. A cold-setting epoxy resin was used as a covering member.

The operating temperatures of the resulting specimens were measured. The resulting operating temperatures were within a range of 126° C.±1° C., and the dispersion of the temperature was sufficiently small.

A heat cycle test was conducted, and the evaluation result was ⊚.

Example 2

A base material of an alloy composition in which 4 weight parts of Ag were added to 100 weight parts of 65% In and the balance Sn was drawn into a wire of 300 µmφ in diameter. The draw-down ratio per dice was 6.5%, and the drawing speed was 45 m/min. In the wire, no breakage occurred.

The wire was cut into pieces of 4 mm, and substrate type thermal fuses were produced in the same manner as Example 1.

The operating temperatures of the resulting specimens were measured. The resulting operating temperatures were within a range of 124° C.±1° C., and the dispersion of the temperature was sufficiently small.

A heat cycle test was conducted, and the evaluation result was ⊚.

Examples 3 to 6

Base materials of alloy compositions listed in Table 1 were drawn into wires of 300 µmφ in diameter. The draw-down ratio per dice was 6.5%, and the drawing speed was 45 m/min. In the wires, no breakage occurred.

The wires were cut into pieces of 4 mm, and substrate type thermal fuses were produced in the same manner as Example 1.

The operating temperatures of the resulting specimens were measured. The resulting operating temperatures are listed in Table 1, In all of the examples, the dispersion of the temperature was sufficiently small.

A heat cycle test was conducted, and the evaluation results are listed in Table 1.

TABLE 1

|  | Ex. 3 | Ex. 4 | Ex. 5 | Ex. 6 |
|---|---|---|---|---|
| In (weight part) | 52 | 52 | 70 | 70 |
| Sn (weight part) | 48 | 48 | 30 | 30 |
| Ag (weight part) | 0.4 | 4 | 0.4 | 4 |
| Operating temperature (° C.) | 119.0 ± 1 | 118.0 ± 1 | 128.0 ± 1 | 127.0 ± 2 |
| Evaluation of heat cycle test | ⊚ | ⊚ | ⊚ | ⊚ |

Examples 7 to 12

Base materials of alloy compositions listed in Table 2 were drawn into wires of 300 µmφ in diameter. The draw-down ratio per dice was 6.5%, and the drawing speed was 45 m/min. In the wires, no breakage occurred.

The wires were cut into pieces of 4 mm, and substrate type thermal fuses were produced in the same manner as Example 1.

The operating temperatures of the resulting specimens were measured. The resulting operating temperatures are listed in Table 2, In all of the examples, the dispersion of the temperature was sufficiently small.

A heat cycle test was conducted, and the evaluation results are listed in Table 2.

TABLE 2

|  | Ex. 7 | Ex. 8 | Ex. 9 | Ex. 10 | Ex. 11 | Ex. 12 |
|---|---|---|---|---|---|---|
| In (weight part) | 52 | 52 | 65 | 65 | 70 | 70 |
| Sn (weight part) | 48 | 48 | 35 | 35 | 30 | 30 |
| Au (weight part) | 0.4 | 4 | 0.4 | 4 | 0.4 | 4 |
| Operating temperature (° C.) | 119.0 ± 1 | 118.0 ± 1 | 126.0 ± 1 | 124.0 ± 2 | 128.0 ± 1 | 127.0 ± 2 |
| Evaluation of heat cycle test | ◎ | ◎ | ◎ | ◎ | ◎ | ◎ |

Examples 13 to 18

Base materials of alloy compositions listed in Table 3 were drawn into wires of 300 μmφ in diameter. The drawdown ratio per dice was 6.5%, and the drawing speed was 45 m/min. In the wires, no breakage occurred.

The wires were cut into pieces of 4 mm, and substrate type thermal fuses were produced in the same manner as Example 1.

The operating temperatures of the resulting specimens were measured. The resulting operating temperatures are listed in Table 3, In all of the examples, the dispersion of the temperature was sufficiently small.

A heat cycle test was conducted, and the evaluation results are listed in Table 3.

TABLE 3

|  | Ex. 13 | Ex. 14 | Ex. 15 | Ex. 16 | Ex. 17 | Ex. 18 |
|---|---|---|---|---|---|---|
| In (weight part) | 52 | 52 | 65 | 65 | 70 | 70 |
| Sn (weight part) | 48 | 48 | 35 | 35 | 30 | 30 |
| Cu (weight part) | 0.4 | 4 | 0.4 | 4 | 0.4 | 4 |
| Operating temperature (° C.) | 119.0 ± 1 | 121.0 ± 2 | 126.0 ± 1 | 128.0 ± 2 | 128.0 ± 1 | 130.0 ± 3 |
| Evaluation of heat cycle test | ◎ | ◎ | ◎ | ◎ | ◎ | ◎ |

Examples 19 to 24

Base materials of alloy compositions listed in Table 4 were drawn into wires of 300 μmφ in diameter. The drawdown ratio per dice was 6.5%, and the drawing speed was 45 m/min. In the wires, no breakage occurred.

The wires were cut into pieces of 4 mm, and substrate type thermal fuses were produced in the same manner as Example 1.

The operating temperatures of the resulting specimens were measured. The resulting operating temperatures are listed in Table 4. In all of the examples, the dispersion of the temperature was sufficiently small.

A heat cycle test was conducted, and the evaluation results are listed in Table 4.

TABLE 4

|  | Ex. 19 | Ex. 20 | Ex. 21 | Ex. 22 | Ex. 23 | Ex. 24 |
|---|---|---|---|---|---|---|
| In (weight part) | 52 | 52 | 65 | 65 | 70 | 70 |
| Sn (weight part) | 48 | 48 | 35 | 35 | 30 | 30 |
| Ni (weight part) | 0.4 | 4 | 0.4 | 4 | 0.4 | 4 |
| Operating temperature (° C.) | 119.0 ± 1 | 121.0 ± 2 | 126.0 ± 1 | 128.0 ± 2 | 128.0 ± 1 | 129.0 ± 2 |
| Evaluation of heat cycle test | ◎ | ◎ | ◎ | ◎ | ◎ | ◎ |

Examples 25 to 30

Base materials of alloy compositions listed in Table 5 were drawn into wires of 300 μmφ in diameter. The drawdown ratio per dice was 6.5%, and the drawing speed was 45 m/min. In the wires, no breakage occurred.

The wires were cut into pieces of 4 mm, and substrate type thermal fuses were produced in the same manner as Example 1.

The operating temperatures of the resulting specimens were measured. The resulting operating temperatures are listed in Table 5. In all of the examples, the dispersion of the temperature was sufficiently small.

A heat cycle test was conducted, and the evaluation results are listed in Table 5.

TABLE 5

|  | Ex. 25 | Ex. 26 | Ex. 27 | Ex. 28 | Ex. 29 | Ex. 30 |
|---|---|---|---|---|---|---|
| In (weight part) | 52 | 52 | 65 | 65 | 70 | 70 |
| Sn (weight part) | 48 | 48 | 35 | 35 | 30 | 30 |
| Pd (weight part) | 0.1 | 4 | 0.4 | 4 | 0.4 | 4 |
| Operating temperature (° C.) | 119.0 ± 1 | 120.0 ± 1 | 126.0 ± 1 | 127.0 ± 1 | 128.0 ± 1 | 129.0 ± 1 |
| Evaluation of heat cycle test | ◎ | ◎ | ◎ | ◎ | ◎ | ◎ |

Examples 31 to 36

Base materials of alloy compositions listed in Table 6 were drawn into wires of 300 μmφ in diameter. The drawdown ratio per dice was 6.5%, and the drawing speed was 45 m/min. In the wires, no breakage occurred.

The wires were cut into pieces of 4 mm, and substrate type thermal fuses were produced in the same manner as Example 1.

The operating temperatures of the resulting specimens were measured. The resulting operating temperatures are listed in Table 6. In all of the examples, the dispersion of the temperature was sufficiently small.

A heat cycle test was conducted, and the evaluation results are listed in Table 6.

TABLE 6

|  | Ex. 31 | Ex. 32 | Ex. 33 | Ex. 34 | Ex. 35 | Ex. 36 |
|---|---|---|---|---|---|---|
| In (weight part) | 52 | 52 | 65 | 65 | 70 | 70 |
| Sn (weight part) | 48 | 48 | 35 | 35 | 30 | 30 |
| Pt (weight part) | 0.4 | 4 | 0.4 | 4 | 0.4 | 4 |

TABLE 6-continued

|  | Ex. 31 | Ex. 32 | Ex. 33 | Ex. 34 | Ex. 35 | Ex. 36 |
|---|---|---|---|---|---|---|
| Operating temperature (° C.) | 119.0 ± 1 | 119.0 ± 2 | 126.0 ± 1 | 126.0 ± 2 | 128.0 ± 1 | 128.0 ± 2 |
| Evaluation of heat cycle test | ⊙ | ⊙ | ⊙ | ⊙ | ⊙ | ⊙ |

Examples 37 to 42

Base materials of alloy compositions listed in Table 7 were drawn into wires of 300 μmφ in diameter. The draw-down ratio per dice was 6.5%, and the drawing speed was 45 m/min. In the wires, no breakage occurred.

The wires were cut into pieces of 4 mm, and substrate type thermal fuses were produced in the same manner as Example 1.

The operating temperatures of the resulting specimens were measured. The resulting operating temperatures are listed in Table 7. In all of the examples, the dispersion of the temperature was sufficiently small.

A heat cycle test was conducted, and the evaluation results are listed in Table 7.

TABLE 7

|  | Ex. 37 | Ex. 38 | Ex. 39 | Ex. 40 | Ex. 41 | Ex. 42 |
|---|---|---|---|---|---|---|
| In (weight part) | 52 | 52 | 65 | 65 | 70 | 70 |
| Sn (weight part) | 48 | 48 | 35 | 35 | 30 | 30 |
| Sb (weight part) | 0.4 | 4 | 0.4 | 4 | 0.4 | 4 |
| Operating temperature (° C.) | 119.0 ± 1 | 122.0 ± 1 | 126.0 ± 1 | 129.0 ± 1 | 128.0 ± 1 | 131.0 ± 1 |
| Evaluation of heat cycle test | ⊙ | ⊙ | ⊙ | ⊙ | ⊙ | ⊙ |

Examples 43 to 45

Base materials of alloy compositions listed in Table 8 were drawn into wires of 300 μmφ in diameter. The draw-down ratio per dice was 6.5%, and the drawing speed was 45 m/min. In the wires, no breakage occurred.

The wires were cut into pieces of 4 mm, and substrate type thermal fuses were produced in the same manner as Example 1.

The operating temperatures of the resulting specimens were measured. The resulting operating temperatures are listed in Table 8. In all of the examples, the dispersion of the temperature was sufficiently small.

A heat cycle test was conducted, and the evaluation results are listed in Table 8.

TABLE 8

|  | Ex. 43 | Ex. 44 | Ex. 45 |
|---|---|---|---|
| In (weight part) | 52 | 65 | 70 |
| Sn (weight part) | 48 | 35 | 30 |
| Ag (weight part) | 0.4 | 0.4 | 0.4 |
| Pd (weight part) | 0.4 | 0.4 | 0.4 |
| Operating temperature | 119.0 ± 1° C. | 126.0 ± 1° C. | 128.0 ± 1° C. |
| Evaluation of heat cycle test | ⊙ | ⊙ | ⊙ |

In Examples 43 to 45, it was ascertained that the kinds of fine intermetallic compounds with In and Sn are increased by the combined addition of Ag and Pd and the heat cycle resistance is superior to that in the case of the single addition.

Comparative Example 1

A base material of 70% In and the balance Sn was used. A drawing process to a wire of 300 μmφ in diameter was attempted while setting the draw-down ratio per dice to 6.5% and the drawing speed to 45 m/min in the same manner as Examples. However, wire breakage frequently occurred because of excessive ductility. Therefore, a wire of 300 μmφ in diameter was obtained while the draw-down ratio per dice was reduced to 4.0%, and the drawing speed was lowered to 20 m/min.

In the same manner as Examples, substrate type thermal fuses were produced, and a heat cycle test was conducted. The evaluation result was Δ or x. Specimens of x were disassembled, with the result that the fuse elements were broken.

Comparative Example 2

A base material of 52% In and the balance Sn was used. A wire of 300 μmφ in diameter was obtained while setting the draw-down ratio per dice to 6.5% and the drawing speed to 45 m/min in the same manner as Examples.

In the same manner as Examples, substrate type thermal fuses were produced, and a heat cycle test was conducted. The evaluation result was Δ or x. Specimens of x were disassembled, with the result that the fuse elements were broken in the same manner as Comparative Example 1.

What is claimed is:

1. A wire member for a thermal fuse element wherein said wire element has an alloy composition in which 0.1 to 7 weight parts of one, two or more metals selected from the group consisting of Ag, Au, Cu, Ni, Pd, Pt, and Sb are added to 100 weight parts of an alloy of 52 to 85% In and a balance Sn.

2. An alloy type thermal fuse wherein a wire member for a thermal fuse element according to claim 1 is used as a fuse element.

3. The alloy type thermal fuse according to claim 2, wherein a heating element for fusing off said fuse element is additionally disposed.

4. The alloy type thermal fuse according to claim 2, wherein an operating temperature of the thermal fuse is 120 to 150° C.

* * * * *